United States Patent
Kim et al.

(10) Patent No.: US 10,609,648 B2
(45) Date of Patent: Mar. 31, 2020

(54) METHOD AND APPARATUS FOR CONTROLLING WIRELESS COMMUNICATION TRANSCEIVER FOR USE IN VEHICLE

(71) Applicants: HYUNDAI MOTOR COMPANY, Seoul (KR); KIA MOTORS CORPORATION, Seoul (KR)

(72) Inventors: Joon Young Kim, Seoul (KR); Ju Won Kim, Anyang-si (KR)

(73) Assignees: HYUNDAI MOTOR COMPANY, Seoul (KR); KIA MOTORS CORPORATION, Seoul (KR)

(*) Notice: Subject to any disclaimer, the term of this patent is extended or adjusted under 35 U.S.C. 154(b) by 0 days.

(21) Appl. No.: 16/113,942

(22) Filed: Aug. 27, 2018

(65) Prior Publication Data
US 2019/0132800 A1    May 2, 2019

(30) Foreign Application Priority Data
Oct. 27, 2017   (KR) .......................... 10-2017-0140806

(51) Int. Cl.
*H04W 52/02* (2009.01)
*H04B 17/309* (2015.01)
(Continued)

(52) U.S. Cl.
CPC ......... *H04W 52/0277* (2013.01); *G01S 19/25* (2013.01); *H03F 3/189* (2013.01);
(Continued)

(58) Field of Classification Search
CPC ..... H04L 67/12; H04L 1/0002; H04L 5/0064; H04L 67/1097; H04L 1/0041; H04L 67/025; H04L 1/1671; H04L 43/045; H04L 63/10; H04L 67/125; H04L 12/16; H04L 12/189; H04L 12/2803; H04L 12/2818; H04L 12/282; H04L 12/44;
(Continued)

(56) References Cited

U.S. PATENT DOCUMENTS

| | | | | |
|---|---|---|---|---|
| 2014/0320391 A1* | 10/2014 | Bazaz | ............... | H04W 52/0277 345/156 |
| 2016/0073351 A1* | 3/2016 | Cardozo | ........... | H04W 52/0258 455/574 |

(Continued)

FOREIGN PATENT DOCUMENTS

| KR | 10-2011-0057727 A | 6/2011 |
|---|---|---|
| KR | 10-1433081 B1 | 10/2014 |

(Continued)

*Primary Examiner* — George Eng
*Assistant Examiner* — Jing Gao
(74) *Attorney, Agent, or Firm* — Brinks Gilson & Lione

(57) ABSTRACT

A method of controlling a wireless communication device used in a vehicle is disclosed. The method includes (1) monitoring strength of signals received via a plurality of receivers and power consumption of signal amplifiers included in the plurality of receivers, (2) determining a level of a localization service based on a location of the vehicle. The method further comprises (3) adjusting operation of at least one of the plurality of receivers according to the level of the localization service and a level of available power in the vehicle.

18 Claims, 6 Drawing Sheets

(51) Int. Cl.
*H03F 3/189* (2006.01)
*G01S 19/25* (2010.01)
*H04W 4/40* (2018.01)
*H04W 4/021* (2018.01)
*H04W 4/02* (2018.01)

(52) U.S. Cl.
CPC .......... *H04B 17/309* (2015.01); *H04W 4/021* (2013.01); *H04W 4/40* (2018.02); *H03F 2200/451* (2013.01); *H04W 4/02* (2013.01)

(58) Field of Classification Search
CPC . H04L 12/6418; H04L 1/0003; H04L 1/1861; H04L 2012/6421; H04L 2012/6427; H04L 41/0677; H04L 41/0806; H04L 41/22; H04L 47/24; H04L 5/0007; H04L 5/001; H04L 5/0044; H04L 5/0046; H04L 5/0053; H04L 5/0078; H04L 5/0096; H04L 63/0853; H04W 4/70; H04W 72/042; H04W 84/18; H04W 4/02; H04W 4/021; H04W 4/80; H04W 52/0277; H04W 88/02; H04W 12/00407; H04W 4/029; H04W 4/38; H04W 52/028; H04W 84/12; H04W 88/06; H04W 24/10; H04W 40/244; H04W 4/40; H04W 64/00; H04W 64/003; H04W 72/0453; H04W 17/309; G01S 19/25
See application file for complete search history.

(56) References Cited

U.S. PATENT DOCUMENTS

| | | |
|---|---|---|
| 2016/0080890 A1 | 3/2016 | Shao |
| 2017/0208540 A1 | 7/2017 | Egner et al. |
| 2018/0184371 A1* | 6/2018 | Puech ................. H04W 52/027 |

FOREIGN PATENT DOCUMENTS

| | | |
|---|---|---|
| KR | 10-1543651 B1 | 8/2015 |
| KR | 10-2016-0057275 A | 5/2016 |

* cited by examiner

METHOD AND APPARATUS FOR CONTROLLING WIRELESS COMMUNICATION TRANSCEIVER FOR USE IN VEHICLE

This application claims priority, under 35 U.S.C. § 119, to Korea Application No. 10-2017-0140806 filed in Korea on Oct. 27, 2017 which is hereby incorporated in its entirety by reference as if fully set forth herein.

BACKGROUND

Field

The present disclosure relates to a method and apparatus for controlling a wireless communication transceiver for use in a vehicle. More particularly, the present disclosure relates to a method and an apparatus for preventing unnecessary power consumption and enabling selective operation by monitoring power consumed in a process of transmitting and receiving data and signals through a plurality of wireless communication transceivers included in a vehicle.

Discussion of Related Art

Combination of a vehicle and Internet of things (IoT) makes it possible to provide various services to a driver or passengers in the vehicle. Herein, IoT may refer to the concept of a network connecting things and space, which forms an intelligent relationship, such as sensing, networking, and information processing, on three distributed environment elements of humans, things, and services under mutual cooperation without explicit human intervention. Things as constituents of IoT include not only home appliances in a wired/wireless network but also humans, vehicles, bridges, various electronic devices, cultural assets, and physical things constituting a natural environment. IoT has evolved into the concept of interacting not only with things but also with all information in real life and the virtual world.

With the development of IoT technology, various devices have come to access the Internet and a large number of IoT devices has been provided even in a household or predetermined space. To offer a variety of services using IoT devices provided in a household or a predetermined space, it is necessary to transmit or store data generated by these devices. Accordingly, an IoT server is used as a network device for performing communication with the IOT devices (i.e., things) and exchanging necessary data.

Most things (e.g., refrigerators or TVs) are used in a fixed location, whereas vehicles are not greatly restricted in a traveling range because they can travel at very high speed. In addition, if refrigerators used in a household are called things, types of services provided by the refrigerators to a user are limited but types of services demanded by a driver or passengers in a vehicle as things may be extremely broad. For this reason, a wireless communication network supported by a vehicle may include short-range communication networks, such as Wi-Fi, Bluetooth, and ZigBee, as well as a mobile communication network.

If corresponding devices in a vehicle are operated in order to use all of a plurality of communication networks, power may be unnecessarily wasted. Particularly, in the case of an electric vehicle using charged electric energy, unnecessary power consumption in communication devices or communication modules of the electric vehicle may restrict mobility of the vehicle. Accordingly, it is necessary to reduce unnecessary power consumption by transceivers used for wireless communication by controlling the transceivers mounted in the vehicle according to the location of the vehicle.

PRIOR ART DOCUMENT

Patent Document (Patent document 0001) KR 10-2016-0057275 A

The disclosure of this section is to provide background of the invention. Applicant notes that this section may contain information available before this application. However, by providing this section, Applicant does not admit that any information contained in this section constitutes prior art.

SUMMARY

An aspect of the present invention provides a method and apparatus for efficiently controlling power consumption of receivers using a plurality of supported short-range wireless communication networks when a localization service based on the location of a vehicle is used in a vehicle supporting IoT.

An aspect of the present invention provides a method and apparatus for controlling power consumption while raising accuracy of the location of a vehicle for a localization service in supporting a localization service of the vehicle through a plurality of short-range wireless communication networks.

The technical objects that can be achieved through embodiments of the present invention are not limited to what has been particularly described hereinabove and other technical objects not described herein will be more clearly understood by persons skilled in the art from the following detailed description.

The above technical solutions are merely some parts of embodiments of the present invention and various embodiments into which technical features of the present invention are incorporated can be derived and understood by persons skilled in the art from the following detailed description.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
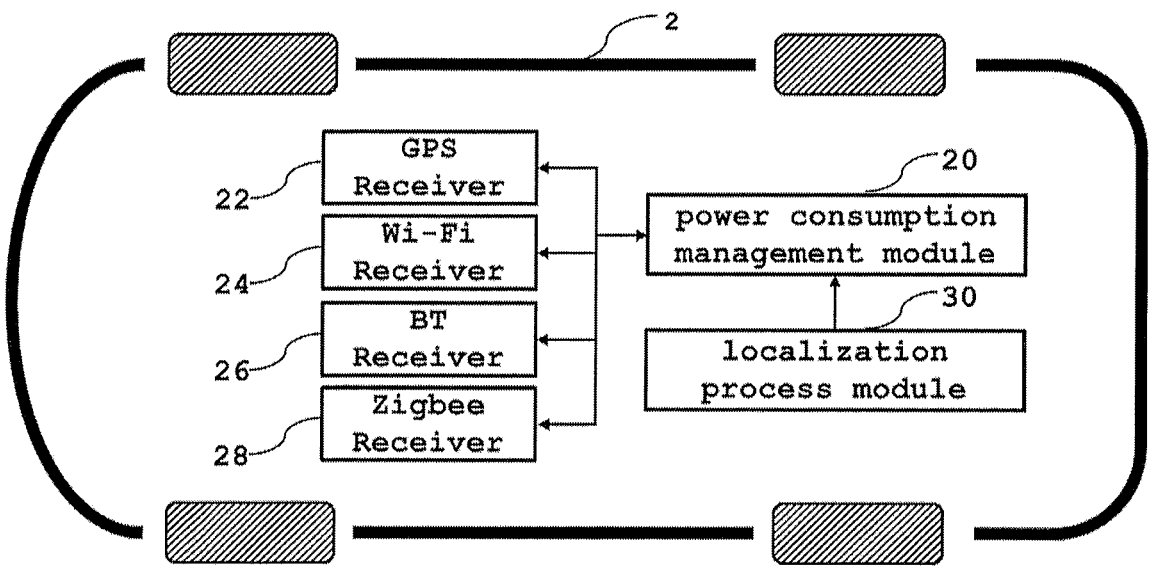
FIG. 1 illustrates a vehicle including an apparatus for controlling a plurality of communication modules (e.g., transceivers) supporting different wireless communication schemes.

Reference will now be made in detail to embodiments of the present invention, examples of which are illustrated in the accompanying drawings. Wherever possible, the same reference numbers will be used throughout the drawings to refer to the same or like parts.

Hereinafter, apparatuses and methods to which embodiments of the present invention are applied will be described in detail with reference to the accompanying drawings. The suffixes "module" and "unit" of elements herein are used for convenience of description and thus can be used interchangeably and do not have any distinguishable meanings or functions.

In describing the embodiments, when an element is referred to as being formed "on" or "under" another element, it can be directly "on" or "under" the other element or be indirectly formed with intervening elements therebetween. When an element is referred to as being "on" or "under," "under the element" as well as "on the element" can be included based on the element.

In embodiments of the invention, a vehicle has a plurality of wireless communication modules for determining its location. Each of the plurality of wireless communication modules uses different wireless communication protocol to determine the vehicle's location. For each wireless communication module, an amplifier is provided to amplify signals received at a corresponding wireless communication module. While the vehicle is driving, when electrical power available for the on-vehicle communication modules becomes lower than sum of minimum operational power of the amplifiers (or lower than a sensed/estimated power consumption of working amplifiers), at least one controller of the vehicle controls operation of the wireless communication modules to shut down at least one module (or at least one amplifier) according to a predetermined priority among the modules such that at least one corresponding amplifier does not consume electrical power. In embodiments, the at least one controller select a target module (or amplifier) to shut down according to a predetermined priority among the modules/amplifiers.

To achieve these objects and other advantages and in accordance with the purpose of the invention, as embodied and broadly described herein, a method of controlling a wireless communication device used in a vehicle includes monitoring power of signals received through antennas by a plurality of receivers and a global positioning system (GPS) receiver, which are wirelessly transmitted in correspondence to different communication technologies, and power used by amplifiers included in the plural receivers and the GPS receiver, for amplifying the signals, determining a level of a localization service based on a location of the vehicle, and adjusting operation of the plural receivers and the GPS receiver, according to the level of the localization service and available power in the vehicle.

The plural receivers may include a Wi-Fi receiver, a Bluetooth receiver, and a Zigbee receiver.

The adjusting may include recognizing the available power in the vehicle; recognizing respective use powers of the amplifiers and respective minimum required powers of the amplifiers; if the amount of the available power is greater than the sum of the amounts of the minimum required powers of the amplifiers, distributing some of the available power in correspondence to the minimum required powers; and if the amount of the available power is less than the sum of the amounts of the minimum required powers of the amplifiers, sequentially cutting off the amplifiers based on priority until the amount of the available power is equal to or greater than the sum of the amounts of the respective minimum required powers of the amplifiers.

The distributing may include distributing power corresponding to a difference between the amount of the available power and the sum of the amounts of the minimum required powers of the amplifiers to an amplifier using a less amount of power than minimum required power of the amplifier.

The adjusting may include lowering power of an amplifier using a larger amount of power than the amount of minimum required power of the amplifier to the minimum required power of the amplifier, and redistributing remaining power after lowering power to other amplifiers.

The priority may differ according to the location of the vehicle.

Location of the vehicle may be determined based on a signal arrival distance from a location signal generating device to the vehicle by comparing power of the signals received by the plural receivers through the antennas with power of the signals set by communication technologies.

Location of the vehicle may be determined using the signal arrival distance, GPS information of the location signal generating device, and GPS information of the vehicle.

The adjusting may further include, cutting off power supplied to an amplifier included in a corresponding receiver when no signal is received by the plural receivers or the GPS receiver through the antennas.

In another aspect of the present invention, an application program is configured to be executed by a processor and is configured to implement the method of controlling the wireless communication device used in the vehicle, wherein the application program is recorded in a computer-readable recording medium.

In another aspect of the present invention, a computer-readable recording medium includes an application program configured to be executed by a processor and configured to implement the method of controlling the wireless communication device used in the vehicle.

In another aspect of the present invention, an apparatus for controlling a wireless communication device used in a vehicle includes a global positioning system (GPS) receiver configured to receive a GPS signal, a plurality of receivers configured to receive signals wirelessly transmitted in correspondence different communication technologies, a localization process module configured to determine a level of a localization service based on a location of the vehicle, and a power consumption management module configured to monitor power of the signals received through antennas by the GPS receiver and the plural receivers and power used by amplifiers for amplifying the signals and to adjust operation of the plural receivers and the GPS receiver, according to the level of the localization service and available power in the vehicle.

The plural receivers may include a Wi-Fi receiver, a Bluetooth receiver, and a Zigbee receiver.

The power consumption management module may recognize the available power in the vehicle, recognize respective use powers of the amplifiers and respective minimum required powers of the amplifiers, distribute some of the available power in correspondence to the minimum required powers, when the amount of the available power is greater than the sum of the amounts of the minimum required powers of the amplifiers, and sequentially cut off the amplifiers based on priority until the amount of the available power is equal to or greater than the sum of the amounts of the minimum required powers of the amplifiers, when the amount of the available power is less than the sum of the amounts of the minimum required powers of the amplifiers.

The power consumption management module may distribute some of the available power by distributing power corresponding to a difference between the amount of the available power and the sum of the amounts of the minimum required powers of the amplifiers to an amplifier using a less amount of power than minimum required power of the amplifier.

The power consumption management module may lower power of an amplifier using a larger amount of power than the amount of minimum required power of the amplifier to the minimum required power of the amplifier, and redistribute remaining power after lowering power to other amplifiers.

The priority may differ according to the location of the vehicle.

The localization process module may determine the location of the vehicle, based on a signal arrival distance from a location signal generating device to the vehicle by comparing power of signals received by the plural receivers through antennas with power of the signals set by communication technologies.

The localization process module may determine the location of the vehicle using the signal arrival distance, GPS information of the location signal generating device, and GPS information of the vehicle.

The power consumption management module may cut off power supplied to an amplifier included in a corresponding receiver when no signal is received by the plural receivers or the GPS receiver through the antennas.

The power consumption management module may include a receiving power monitoring module configured to monitor power of the received signals and power of signals amplified by the amplifiers and output monitored power, a localization variance monitoring module configured to monitor variation in information for the localization service in correspondence to variation in the location of the vehicle, and a control and decision module configured to control power supplied to the plural receivers and the GPS receiver According to an embodiment, a method and apparatus are provided for efficiently managing consumption of power used to receive signals when a localization service (e.g., location-based service or location tracking) is performed through an IoT device. The embodiment can efficiently manage energy consumption during location tracking using the IoT device. Particularly, the embodiment may be applied to a vehicle including a plurality of receivers capable of receiving signals according to corresponding wireless communication technologies so that the location of the vehicle may be sensed using a plurality of wireless communication technologies of different types.

FIG. 1 illustrates a vehicle including an apparatus for controlling a plurality of communication modules (e.g., transceivers) supporting different wireless communication schemes.

As illustrated, a vehicle 2 may include a plurality of communication modules used to recognize the location of the vehicle 2. Herein, the communication modules are devices capable of performing wireless communication for transmitting and receiving signals and data according to different communication schemes (communication technologies). The communication modules may be implemented by modules, chips, or circuits which are distinguishable according to communication schemes. The vehicle 2 may include the apparatus for controlling the wireless communication device for use in the vehicle to control the plural communication modules.

The vehicle 2 may include a global positioning system (GPS) receiver (or a GPS module) 22 for receiving a signal from a GPS (e.g., a GPS satellite). For example, a navigation device mounted in the vehicle 2 may recognize the location of the vehicle 2 by receiving the GPS signal and display the location of the vehicle 2 on a map. Although the GPS signal is used to recognize the location of the vehicle, an error range and an error rate (including a problem of reception blockage) are relatively large. For this reason, it may be very difficult to accurately calculate the location of the vehicle 2 only by the GPS signal. Therefore, the vehicle 2 needs to calculate an accurate location thereof using other devices supporting wireless communication in addition to the GPS receiver 22.

The vehicle 2 may include a plurality of receivers for receiving signals which are wirelessly transmitted in correspondence to different communication technologies. For example, the plural receivers may include a Wi-Fi receiver (or a Wi-Fi module) 24, a Bluetooth (BT) receiver (or a BT module) 26, and a Zigbee receiver (or a Zigbee module) 28. Since Wi-Fi, BT, and Zigbee, which correspond to short-range wireless communication network technologies, may be used in a limited range, they may be used for more accurate location measurement within usable ranges of corresponding technologies. The Wi-Fi receiver 24, the BT receiver 26, and the Zigbee receiver 28 mounted in the vehicle 2 may be used for various location-based services supported by corresponding communication schemes as well as for simple location measurement.

The vehicle 2 may include a localization process module 30 for determining a level of a localization service based on the location of the vehicle. The localization process module 30 serves to calculate the location of the vehicle. For accurate location calculation, the localization process module 30 may receive necessary information from the GPS receiver 22, the Wi-Fi receiver 24, the BT receiver 26, the Zigbee receiver 28, and a Z-wave receiver (not shown). Herein, the necessary information may be power of the signals received by the plural receivers and the GPS receiver.

The strength of a wireless communication signal may vary with a distance from a signal transmitting device to a signal receiving device. For example, as the distance between the transmitting device and the receiving device increases, the strength of a signal received by the receiving device may decrease. Since the location of the vehicle determined by the strength of a signal is a distance from the transmitting device to the receiving device, if the location of the transmitting device is accurate, the location range of the receiving device may be limited. For example, if the vehicle 2 receives a plurality of signals of different wireless communication schemes at a specific location, limits location ranges with respect to the respective signals, and then limits the location of the vehicle 2 to an area satisfying all of the limited location ranges, the location of the vehicle 2 may be more accurately determined. For example, the localization process module 30 may determine the location of the vehicle 2 based on a signal arrival distance from a location signal generating device to the vehicle by comparing power of signals received by the plural receivers through antennas with power of the signals set by communication technologies. The localization process module 30 may specifically determine the location of the vehicle using the signal arrival distance, GPS information of the location signal generating device, and GPS information received by the vehicle 2.

The apparatus for controlling the wireless communication device used in the vehicle may include a power consumption management module 20 for monitoring power of signals received through antennas by the GPS receiver 22 and the receivers 24, 26, and 28 and power used by amplifiers for amplifying the signals and controlling operation of the receivers 24, 26, and 28 and the GPS receiver 22 according to a level of a localization service determined through the localization process module 30 and available power of the vehicle in a current state.

The power consumption management module 20 may recognize the available power in the vehicle and recognize respective use powers of the amplifiers included in the receivers 24, 26, and 28 and the GPS receiver 22 and respective minimum required powers of the amplifiers. If the amount of available power is greater than the sum of the amounts of the minimum required powers of the amplifiers, the power consumption management module 20 may distribute some of the available power in correspondence to the minimum required powers of the amplifiers. If the amount of the available power is less than the sum of the amounts of the minimum required powers of the amplifiers, the power consumption management module 20 may sequentially cut off the amplifiers based on priority until the amount of the available power is equal to or greater than the sum of the amounts of the minimum required powers of the amplifiers.

The vehicle 2 may limitedly use power. Since mobility should be guaranteed, the vehicle 2 may store a preset amount of electrical energy in a battery therein and electric energy may be used by a necessary amount while the vehicle 2 travels. The vehicle 2 includes numerous electronic devices. A part of these devices may be provided for convenience of a driver or passengers but some of the electronic devices of the vehicle 2 may have an important effect on traveling of the vehicle 2. Accordingly, systematic and planned management of consumption of energy stored in the vehicle may greatly affect the performance of the vehicle 2.

As a plurality of communication devices has been mounted in the vehicle 2, power consumed by the communication devices has increased and power consumed by the communication devices to improve the performance of the vehicle 2 has reached a degree that cannot be negligible. Accordingly, it is very important for the vehicle 2 to recognize available power and to efficiently distribute and allocate the available power. As described above, if the amount of the available power in the vehicle is greater than the sum of the amounts of the minimum required powers in the communication modules mounted in the vehicle 2, this situation indicates that the vehicle may sufficiently use power and the vehicle may distribute power to communication modules or receivers requiring much power. That is, in order to distribute some of the available power in the apparatus for controlling the wireless communication device, the power consumption management module 20 may distribute power corresponding to the difference between the amount of the available power and the sum of the amounts of the minimum required powers of the amplifiers to an amplifier using a less amount of power than minimum required power of the amplifier.

Conversely, if the amount of available power in the vehicle 2 is less than the sum of the amounts of the respective minimum required powers needed in the communication modules, this situation indicates that power is lacking in the communication modules mounted in the vehicle and it is necessary to stop using power in some of the communication modules. If all of the communication modules mounted in the vehicle use power in a situation in which there is a lack of power, inaccurate information may be collected by the vehicle or excessive electrical energy may be consumed in the vehicle, thereby having a negative influence on the performance and safety of the vehicle.

If any amplifier uses a larger amount of power than the amount of minimum required power thereof, the power consumption management module 20 may lower power of the amplifier to the minimum required power of the amplifier and redistribute remaining power after lowering power to other amplifiers. Upon monitoring use of power in the communication modules mounted in the vehicle, the power consumption management module 200 may sense a communication module using a larger amount of power than necessary. In this case, the power consumption management module 20 may distribute the remaining amount of power except for the amount of power required by the corresponding communication module to other communication modules.

When there is a lack of power for all of the communication modules mounted in the vehicle 2 to use power, priority for determining a communication module, use of which is to be stopped, may differ according to the location of the vehicle 2. This is because information that the vehicle 2 collects may differ according to variation in the location of the vehicle 2 (or variation in a traveling environment of the vehicle 2) and a location-based service provided to the vehicle may differ according to the location of the vehicle 2.

When no signal is received by the receivers 24, 26, and 28 or the GPS receiver 22 mounted in the vehicle 2, the power consumption management module 20 may cut off power supplied to an amplifier included in a corresponding receiver. For example, although a signal is received by the Wi-Fi receiver at a specific location of the vehicle 2, there may be no signal received by the Zigbee receiver 28. In this case, the power consumption management module 20 may cut off power supplied to the amplifier of the Zigbee receiver 28. In addition, a predetermined condition such as traveling of the vehicle 2 or lapse of a preset time is satisfied, the power consumption management module 20 may again supply power to the amplifier of the Zigbee receiver 28.

IoT devices may include communication modules, such as the GPS receiver 22, the Wi-Fi receiver 24, the BT receiver 26, the Zigbee receiver 28, and the Z-wave receiver, and control modules for actually controlling the IoT devices and providing a service to the IoT device. Each receiver may include an amplifier. According to the embodiment, each receiver, may be adjusted such that electrical energy may be efficiently used in the receiver, based on power consumed for operation of the amplifier of the receiver and power of a received signal. According to the embodiment, although signals are received through the communication modules, the communication modules may be selectively activated or power supplied to the communication modules may be flexibly adjusted, based on a preset amount of power consumption.

According to the embodiment, a circuit or a program for determining whether a signal is received and adjusting power consumption may be controlled by an energy control module that receives power data and data on the amount of power of a received signal. Thereby, the communication modules that are selectively used for localization may be employed and the amount of power consumption may be adjusted. The embodiment may be applied to IoT devices, which are mounted in the vehicle or connected to the vehicle to interwork with the vehicle, or wireless communication modules, which relate to an IoT service, for a localization service.

In the above-described embodiment, the power consumption management module 20 may monitor and adjust the amount of power consumption of the amplifier included in each of the receivers 24, 26, and 28 and the GPS receiver 22. To this end, the power consumption management module 20 may calculate the total amount of power consumption of the amplifiers and determine whether to operate the amplifiers based on location information of the vehicle 2 and a power state (available power) in the vehicle 2. Then, the embodiment can solve problems generated by a conventional vehicle that cannot monitor power consumed in communication modules mounted for a localization service or a location-based service and results in a lack of electrical energy, deterioration of traveling performance of the vehicle, or threatening of traveling safety caused by inefficient power management.

Figure 2:
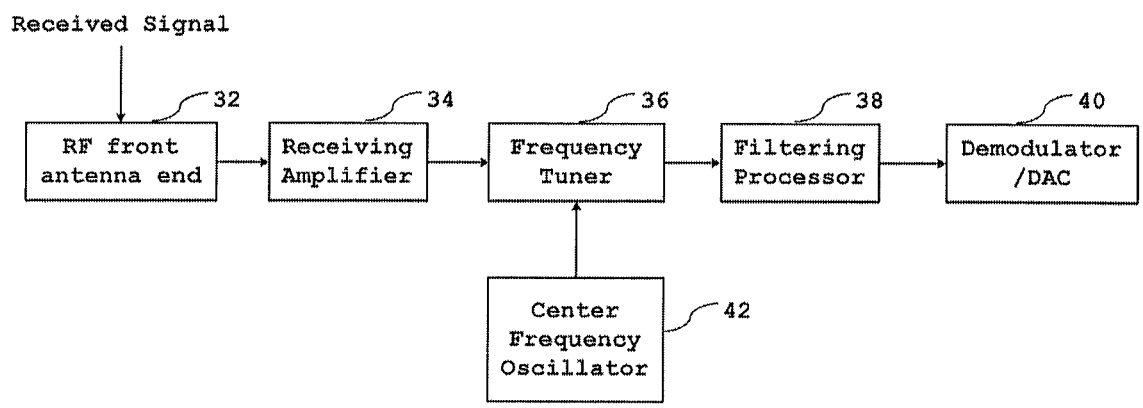
FIG. 2 illustrates the structure of a receiver corresponding to each of the communication modules.

FIG. 2 illustrates the structure of a receiver corresponding to each of the communication modules.

As illustrated, each of the receivers 24, 26, and 28 and the GPS receiver 22 described with reference to FIG. 1 may include various elements. Each receiver may include a radio frequency (RF) front antenna end 32 for directly receiving a signal through an antenna, a receiving amplifier 34 for amplifying the strength of the received signal, a center frequency oscillator 42 for generating a preset frequency signal, a frequency tuner 36 for shifting the frequency of the received signal to a baseband frequency from a carrier frequency, using the frequency signal generated by the oscillator 42, a filtering processor 38 for eliminating noise from a signal, and a demodulator/digital-to-analog converter (DAC) 40 for demodulating a modulated signal and converting a digital signal into an analog signal.

The receiver may recognize the strength of a signal sensed by the RF front antenna end 32 as power of a received signal and recognize power consumed by the amplifier 34 through a result of being amplified by the amplifier 34 and power of the received signal.

If power of the received signal is sufficient, it may be unnecessary to amplify the signal through the amplifier 34. Therefore, the power consumption management module 20 described in FIG. 1 may adjust power supplied to the amplifier when the strength of a signal received by the communication module is sufficient.

Figure 3:
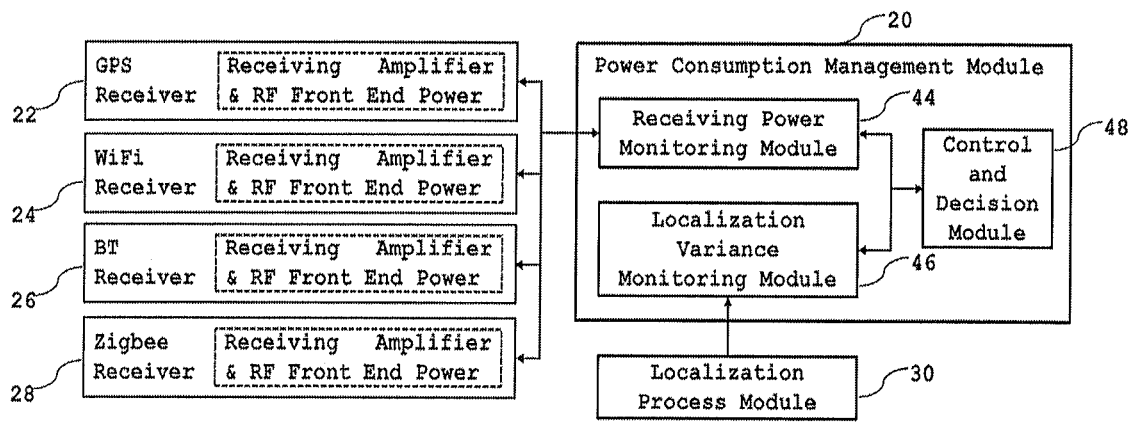
FIG. 3 illustrates an apparatus for controlling power consumed by the receiver.

FIG. 3 illustrates an apparatus for controlling power consumed by the receiver.

As illustrated, each of the receivers 24, 26, and 28 and the GPS receiver 22 may transmit power of a received signal and power of a signal amplified by the amplifier to the power consumption management module 20, as described with reference to FIGS. 1 and 2.

Specifically, the power consumption management module may include a receiving power monitoring module 44 for recognizing the strength of a signal sensed by the RF front antenna end 32 (refer to FIG. 2) as power of the received signal and monitoring a result of being amplified by the amplifier 34 (refer to FIG. 2), a localization variance monitoring module 46 for monitoring operation in the localization process module 30 including a process module for localization service and variance of control module data, and a control and decision module 48 for controlling operation of the receivers 24, 26, and 28 and the GPS receiver 22 based on information recognized by the receiving power monitoring module 44 and the localization variance monitoring module 46.

The localization process module 30 interworking with the localization variance monitoring module 46 may include the process module of the localization service. The process module for the localization service included in the localization process module 30 may be plural in number and may differ according to a service or a traveling control technique provided to the vehicle 2 (refer to FIG. 1).

Figure 4:
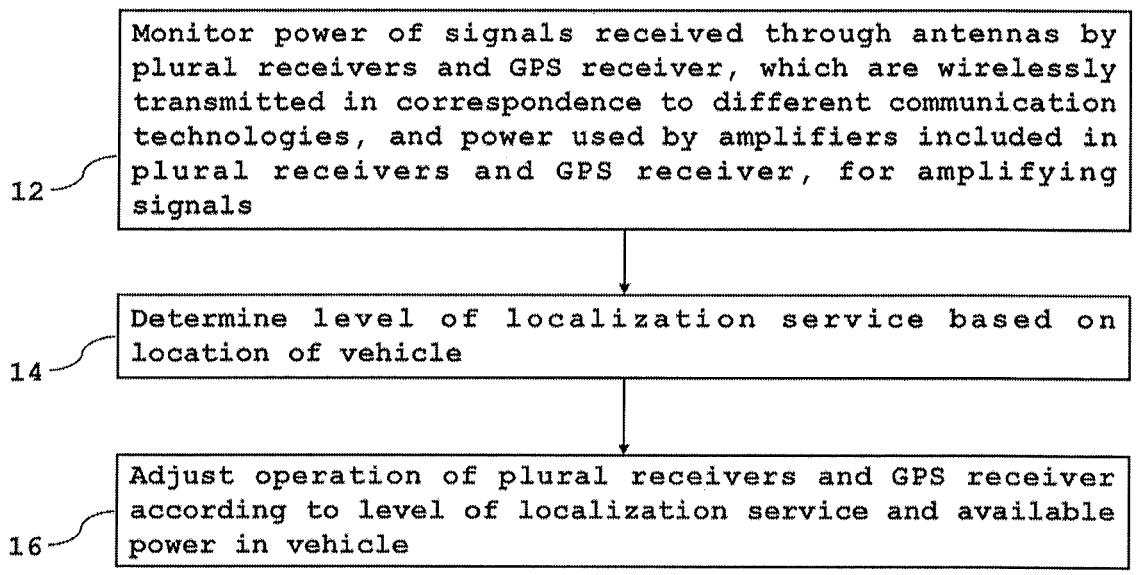
FIG. 4 illustrates a control method of a wireless communication device used in a vehicle.

FIG. 4 illustrates a control method of a wireless communication device used in a vehicle.

As illustrated, the control method of the wireless communication device used in the vehicle may include step 12 of monitoring power of signals received through antennas by a plurality of receivers and a GPS receiver, which are wirelessly transmitted in correspondence to different communication technologies, and power used by amplifiers included in the plural receivers and the GPS receiver, for amplifying the signals, step 14 of determining a level of a localization service based on the location of the vehicle, and step 16 of adjusting operation of the plural receivers and the GPS receiver according to the level of the localization service and available power in the vehicle.

The plural receivers may include a Wi-Fi receiver, a BT receiver, a Zigbee receiver, etc.

According to the embodiment, step 16 may include recognizing the available power in the vehicle, recognizing respective use powers of the amplifiers and respective minimum required powers of the amplifiers, distributing some of the available power in correspondence to the minimum required powers when the amount of the available power is greater than the sum of the amounts of the respective minimum required powers of the amplifiers, and sequentially cutting off the amplifiers based on priority until the amount of the available power is equal to or greater than the sum of the amounts of the respective minimum required powers of the amplifiers, when the amount of the available power is less than the sum of the amounts of the respective minimum required powers of the amplifiers.

To distribute some of power, the control method of the wireless communication device used in the vehicle may include distributing power corresponding to the difference between the amount of the available power and the sum of the amounts of the minimum required powers of the amplifiers to an amplifier using a less amount of power than minimum required power of the amplifier.

According to the embodiment, step 16 may further include lowering power of an amplifier using a larger amount of power than the amount of minimum required power of the amplifier to the minimum required power of the amplifier and redistributing remaining power remaining after lowering power to other amplifiers.

The priority for determining which receiver is selected or adjusted in adjusting or controlling the plural receivers and the GPS receiver may differ according to the location of the vehicle. Particularly, the priority may vary with a localization service which can be provided according to the location of the vehicle.

In addition, the location of the vehicle may be determined based on a signal arrival distance from a location signal generating device to the vehicle by comparing power of signals received by the plural receivers through antennas with power of the signals set by communication technologies. Particularly, the location of the vehicle may be specifically determined using the signal arrival distance, GPS information of the location signal generating device, and GPS information of the vehicle.

According to the embodiment, step 16 may further include cutting off power supplied to an amplifier included in a corresponding receiver when no signal is received by the plural receivers or the GPS receiver through the antennas. In this case, even though power supplied to the amplifier is cut off, if the vehicle travels and a level of a localization service is changed, power may again be supplied.

Figure 5:
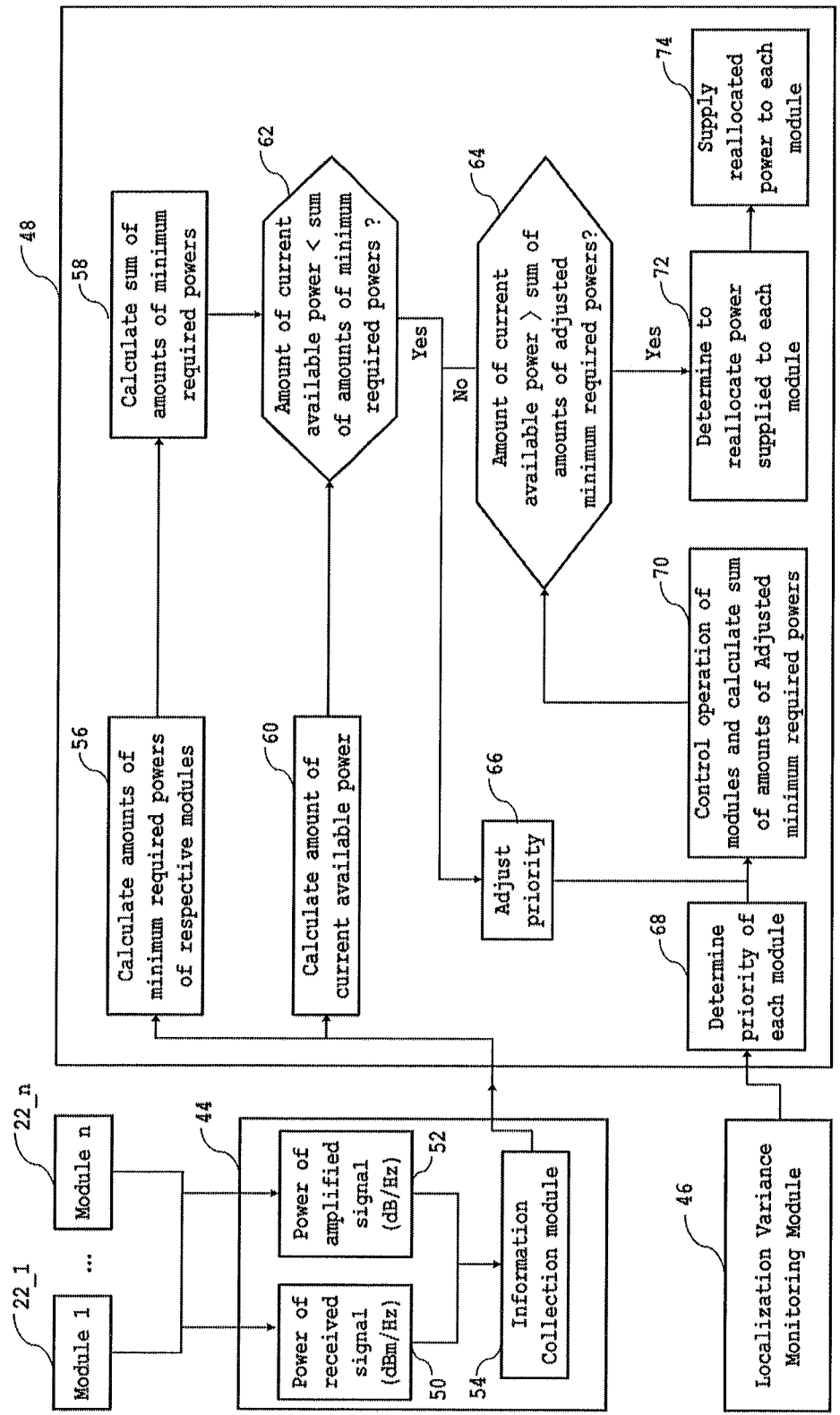
FIG. 5 illustrates construction and operation of a power consumption management module.

FIG. 5 illustrates construction and operation of a power consumption management module.

As illustrated, the power consumption management module may include a receiving power monitoring module 44, a localization variance monitoring module 46, and a control and decision module 48.

The receiving power monitoring module 44 may monitor power (in dBm/Hz) of a signal received from each of a plurality of communication modules 22_1, . . . , 22_n (where n is a natural number greater than 2) and power (in dB/Hz) of a signal amplified by each of amplifiers included in the communication modules (steps 50 and 52). An information collection module 54 converts the monitored powers into data of a preset format and transmits the converted data to the control and decision module 48.

The localization variance monitoring module 46 may monitor variance in data, parameters, and location information as the vehicle travels and transmit the variance to the control and decision module 48.

The control and decision module 48 calculates the amounts of minimum required powers of the respective modules based on the data transmitted by the information collection module 54 (step 56). Thereafter, the control and decision module 48 calculates the sum of the amounts of the minimum required powers demanded by the communication modules (step 58).

The control and decision module 48 calculates the amount of current available power (step 60).

The control and decision module 48 may compare the amount of the current available power with the sum of the amounts of the minimum required powers (step 62) and adjust priority when the sum of the amounts of the minimum required powers is greater than the amount of the available power (step 66).

According to the embodiment, the control and decision module 48 may determine priority of each of the communication modules according to the data, parameters, and location information transmitted by the localization variance monitoring module 46 (step 68).

The control and decision module 48 may determine whether to operate the communication modules 22_1, . . . , 22_n based on the determined or adjusted priority. Thereafter, the control and decision module 48 may calculate the sum of the amounts of adjusted minimum required powers demanded by the communication modules 22_1, . . . , 22_n (step 70).

The control and decision module 48 compares the amount of the current available power with the sum of the amounts of the adjusted minimum required powers (step 64). If the amount of the current available power is greater than the sum, the control and decision module 48 may determine to reallocate power supplied to the communication modules 22_1, . . . , 22_n (step 72). Next, the control and decision module 48 may supply the reallocated power to the communication modules 22_1, . . . , 22_n (step 74).

Figure 6:
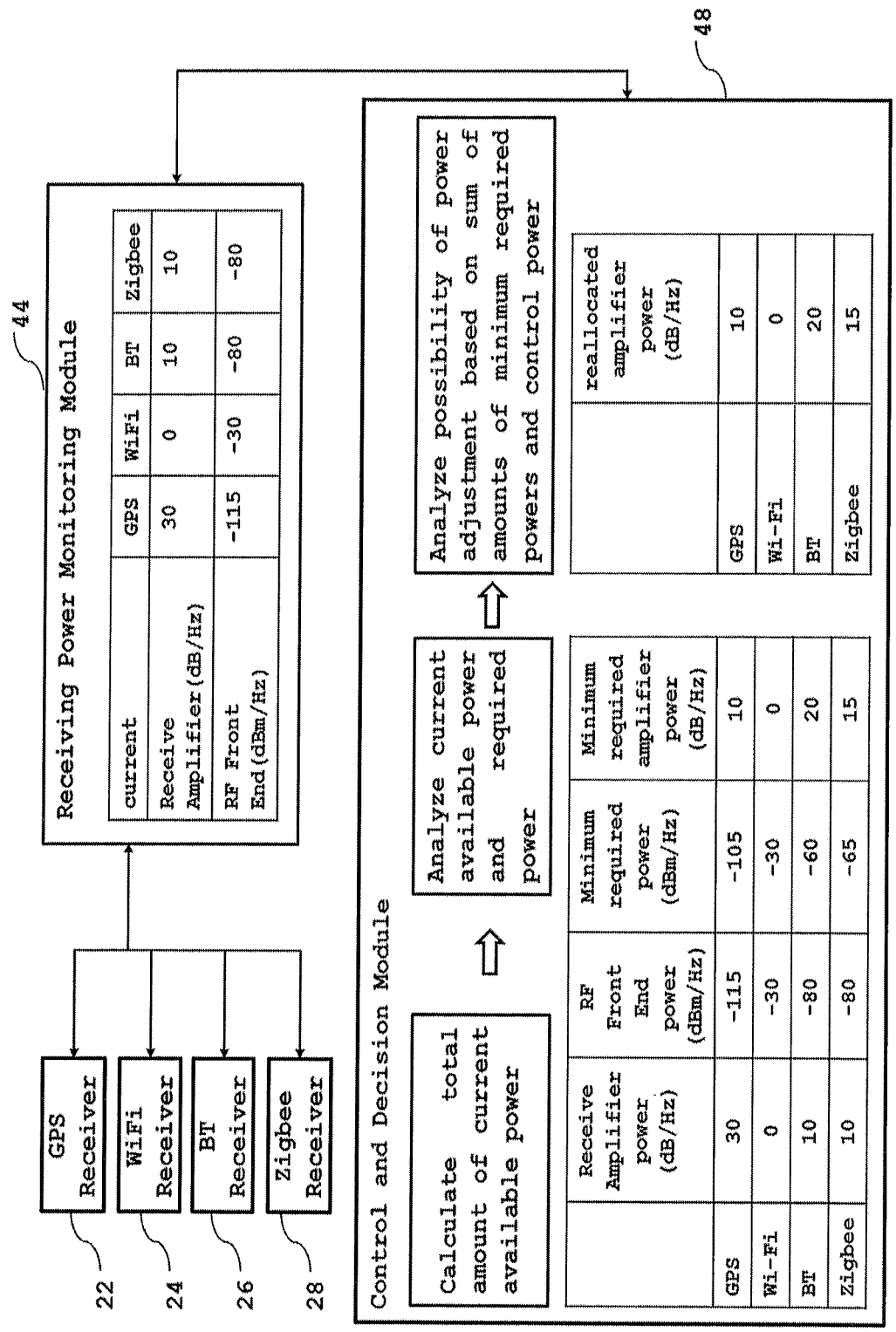
FIG. 6 illustrates a first example for controlling the wireless communication device used in the vehicle.

FIG. 6 illustrates a first example for controlling the wireless communication device used in the vehicle.

As illustrated, the first example may describe a process of adjusting or additionally allocating power supplied to the amplifiers included in the receivers 24, 26, and 28 and the GPS receiver 22.

First, the receiving power monitoring module 44 may collect power of a signal received from each of the receivers 24, 26, and 28 and the GPS receiver 22 and power of an amplified signal. For example, power of a signal received from the GPS receiver 22 may be −115 dBm/Hz and power of a signal amplified by the amplifier in the GPS receiver 22 may be 30 dB/Hz. Power of a signal received from the Wi-Fi receiver 24 may be −30 dBm/Hz and power of a signal amplified by the amplifier in the Wi-Fi receiver 24 may be 0 dB/Hz.

The control and decision module 48 may calculate a total amount of current available power. For example, the current available power may be 50 dB/Hz.

Next, the control and decision module 48 may analyze the current available power and required power. For example, the sum of the amounts of minimum required powers demanded by the respective communication modules may be 45 dB/Hz.

The control and decision module 48 may analyze the possibility of power adjustment and allocation based on the sum of the amounts of the minimum required powers and perform power control. First, the control and decision module 48 may compare the amount of the current available power with the sum of the amounts of the minimum required powers and recognize that power may be additionally allocated.

The control and decision module 48 may redistribute power according to the minimum required powers demanded by the respective communication modules. For example, power supplied to the GPS receiver may be lowered from 30 dB/Hz to 10 dB/Hz, whereas power supplied to the BT receiver 26 may increase from 10 dB/Hz to 20 dB/Hz. Power supplied to the Zigbee receiver 28 may increase from 10 dB/Hz to 15 dB/Hz in correspondence to minimum required power.

Figure 7:
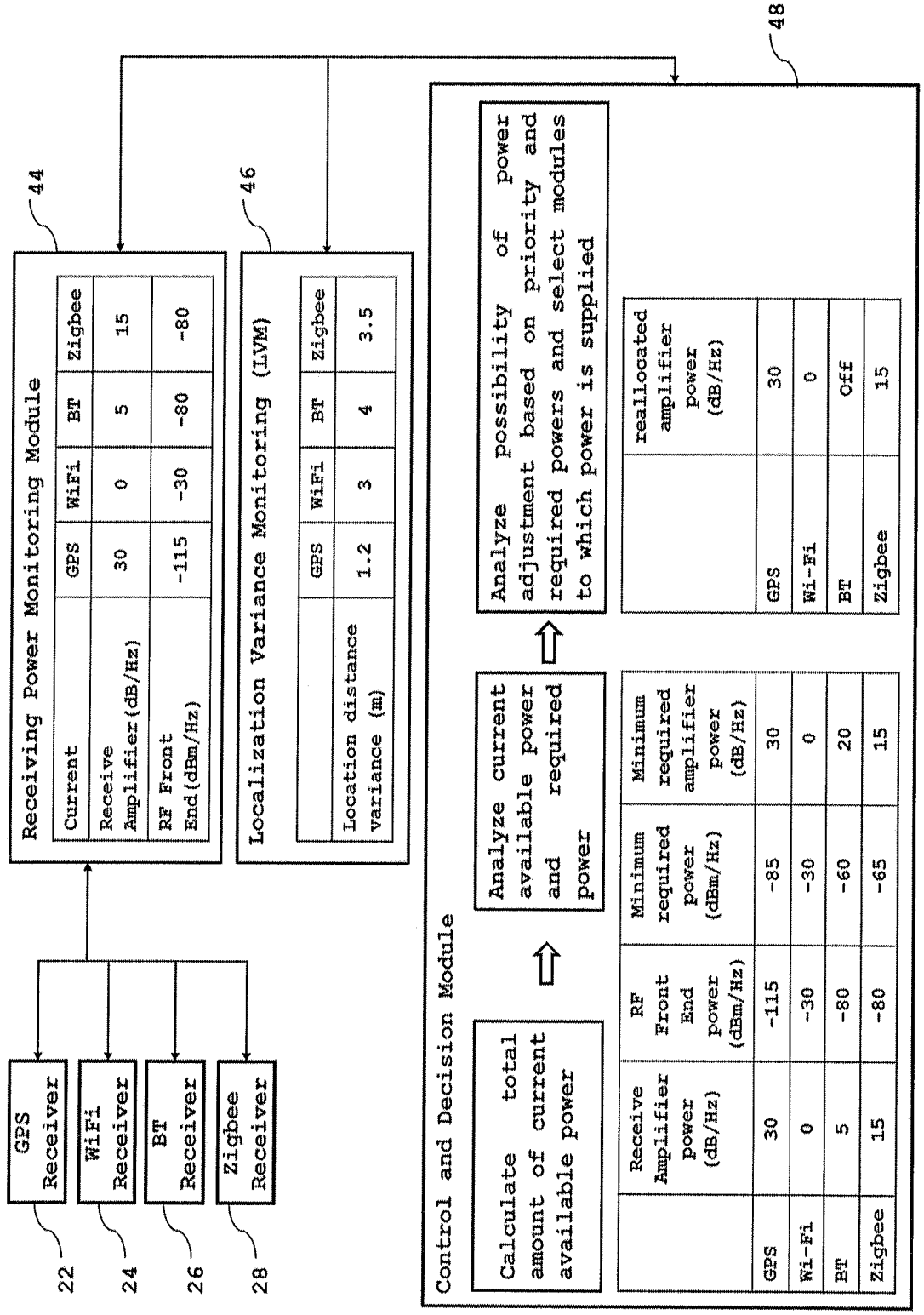
FIG. 7 illustrates a second example for controlling the wireless communication device used in the vehicle.

FIG. 7 illustrates a second example for controlling the wireless communication device used in the vehicle.

As illustrated, the second example may describe a process of reducing power supplied to the amplifiers included in the receivers 24, 26, and 28 and the GPS receiver 22.

First, the receiving power monitoring module 44 may collect power of a signal received from each of the receivers 24, 0.26, and 28 and the GPS receiver 22 and power of an amplified signal. For example, power of a signal received from the GPS receiver 22 may be −115 dBm/Hz and power of a signal amplified by the amplifier in the GPS receiver 22 may be 30 dB/Hz. Power of a signal received from the Wi-Fi receiver 24 may be −30 dBm/Hz and power of a signal amplified by the amplifier in the Wi-Fi receiver 24 may be 0 dB/Hz.

The control and decision module 48 may calculate a total amount of current available power. For example, the current available power may be 50 dB/Hz.

Next, the control and decision module 48 may analyze the current available power and required power. For example, the sum of the amounts of minimum required powers demanded by the respective communication modules may be 65 dB/Hz.

The control and decision module 48 may analyze the possibility of power adjustment and allocation based on the sum of the amounts of the minimum required powers and perform power control. First, the control and decision module 48 may compare the amount of the current available power with the sum of the amounts of the minimum required powers and recognize that power cannot be additionally allocated (current available power 50 dB/Hz<sum 65 dB/Hz of minimum required powers).

The control and decision module 48 may redistribute power according to the minimum required powers demanded by the respective communication modules. The control and decision module 48 may recognize a location variance value of each of the receivers 24, 26, and 28 and the GPS receiver 22 through the localization variance monitoring module 46 and set priority. Herein, power supplied to the receivers may be cut off in order of the BT receiver 26, the Zigbee receiver 28, the Wi-Fi receiver 24, and the GPS receiver 22.

According to priority, power supplied to the BT receiver 26 may be cut off and the sum of the amounts of minimum required powers demanded by the other communication modules, i.e., the Zigbee receiver 28, the Wi-Fi receiver 24, and the GPS receiver 22, may be recalculated. For example, the recalculated sum may be 45 dB/Hz. Since this value is lower than the current available power of 50 dB/Hz, power allocation is possible. Accordingly, power supplied to the BT receiver 26 is cut off and power may be supplied to the Zigbee receiver 28, the Wi-Fi receiver 24, and the GPS receiver 22.

Figure 8:
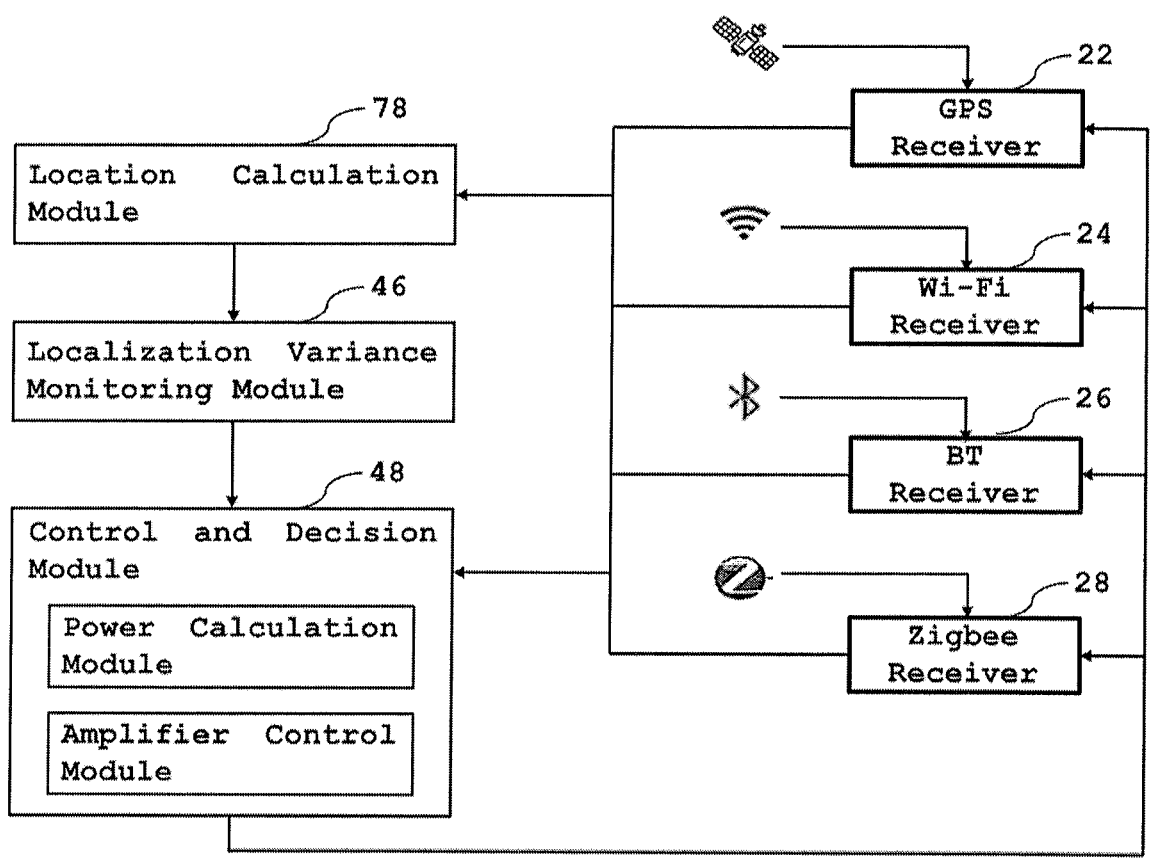
FIG. 8 illustrates location determination through the wireless communication device used in the vehicle.

FIG. 8 illustrates location determination through the wireless communication device used in the vehicle.

As illustrated, for real-time location determination, the vehicle may receive a signal from the exterior. According to the embodiment, data (e.g., data after decoding is ended in FIG. 2) corresponding to signals received through the GPS receiver 22, the Wi-Fi receiver 24, the BT receiver 26, and the Zigbee receiver 28 from the exterior may be transmitted to a location calculation module 78.

In addition, powers of output signals (e.g., output signals of the RF front antenna end 32 of FIG. 2) received through the GPS receiver 22, the Wi-Fi receiver 24, the BT receiver 26, and the Zigbee receiver 28 and powers of amplified signals (e.g., output signals of the amplifier 34 of FIG. 2) may be transmitted to the control and decision module 48.

A variance value according to location information, calculated by the location calculation module 78, may be recognized by the localization variance monitoring module 46 and the variance value may be transmitted to the control and decision module 48.

Next, if the amount of current available power is less than the sum of the amounts of minimum required powers of the GPS receiver 22, the Wi-Fi receiver 24, the BT receiver 26, and the Zigbee receiver 28, the control and decision module 48 may determine that power consumed by the GPS receiver 22, the Wi-Fi receiver 24, the BT receiver 26, and the Zigbee receiver 28 is greater than the available power and adjust power supplied to the GPS receiver 22, the Wi-Fi receiver 24, the BT receiver 26, and the Zigbee receiver 28 as described with reference to FIG. 7.

If power supplied to the GPS receiver 22, the Wi-Fi receiver 24, the BT receiver 26, and the Zigbee receiver 28 is changed by the control and decision module 48, then the GPS receiver 22, the Wi-Fi receiver 24, the BT receiver 26, and the Zigbee receiver 28 may process data (e.g., data output through the elements described in FIG. 2) in correspondence to the changed power.

The GPS receiver 22, the Wi-Fi receiver 24, the BT receiver 26, and the Zigbee receiver 28 may transmit the processed data to the location calculation module 78 in correspondence to the changed power. The location calculation module 78 may change data according to variance in the location of the vehicle and data for a localization service.

According to the above-described embodiment, when the plural communication modules are provided, energy efficiency during data reception through the communication modules can be improved using an apparatus and circuit for managing power supplied to the communication modules. In addition, a location-based service and a localization service may be used by selectively using the plural communication modules. Furthermore, problems caused by a lack of power may be prevented with respect to a vehicle storing limited electric energy.

The method according to the above-described embodiments may be implemented as a computer-executable program that can be recorded in a computer-readable medium. Examples of the computer-readable medium include a read only memory (ROM), a random access memory (RAM), a compact disc (CD)-ROM, a magnetic tape, a floppy disk, and an optical data storage.

The computer-readable recording medium may be distributed over a computer system connected to a network so that computer-readable code is written thereto and executed therefrom in a decentralized manner. Functional programs, code, and code segments needed to realize the above-described method may be easily derived by programmers skilled in the art.

The effects of the apparatus according to certain embodiments of the present invention are as follows.

According to certain embodiments of the present invention, power consumed upon determination of the location of a vehicle using IoT devices can be efficiently managed.

According to certain embodiments of the present invention, power consumed upon use of a localization service through a plurality of devices mounted in the vehicle can be efficiently managed.

According to certain embodiments of the present invention, the location of the vehicle, which is required to provide a localization service, can be more accurately recognized using a plurality of signals that can be received through a plurality of short-range wireless communication networks.

According to certain embodiments of the present invention, mobility of the vehicle during traveling can be increased and traveling performance can be improved, by efficiently managing power consumed to transmit and receive signals or data through a plurality of short-range wireless communication networks to reduce power consumed in the vehicle and by reserving power to be used for other devices.

Logical blocks, modules or units described in connection with embodiments disclosed herein can be implemented or performed by a computing device having at least one processor, at least one memory and at least one communication interface. The elements of a method, process, or algorithm described in connection with embodiments disclosed herein can be embodied directly in hardware, in a software module executed by at least one processor, or in a combination of the two. Computer-executable instructions for implementing a method, process, or algorithm described in connection with embodiments disclosed herein can be stored in a non-transitory computer readable storage medium.

The effects that can be achieved through embodiments of the present invention are not limited to what has been particularly described hereinabove and other advantages of embodiments of the present invention will be more clearly understood by persons skilled in the art from the above detailed description.

It will be apparent to those skilled in the art that various modifications and variations can be made in embodiments of the present invention without departing from the spirit or scope of the invention.

Thus, it is intended that the present disclosure cover the modifications and variations of this invention provided they come within the scope of the appended claims and their equivalents.

What is claimed is:

1. A method of controlling a wireless communication device used in a vehicle, the method comprising:
monitoring power of signals received through antennas by a plurality of receivers and a global positioning system (GPS) receiver, the signals are wirelessly transmitted in correspondence to different communication technologies, and monitoring power used by amplifiers included in the plurality of receivers and the GPS receiver, for amplifying the signals;
determining a level of a localization service based on a location of the vehicle; and
adjusting operation of the plurality of receivers and the GPS receiver, according to the level of the localization service and an amount of available power in the vehicle,
wherein the adjusting comprises:
recognizing the amount of the available power in the vehicle;
recognizing respective amount of use powers of the amplifiers and respective amount of minimum required powers of the amplifiers; and
when the amount of the available power is greater than a sum of the amounts of the minimum required powers of the amplifiers, distributing some of the amount of the available power corresponding to a difference between the amount of the available power and the sum of the amounts of the minimum required powers of the amplifiers to an amplifier using a less amount of power than minimum required power of the amplifier.

2. The method according to claim 1, wherein the plurality of receivers include a Wi-Fi receiver, a Bluetooth receiver, and a Zigbee receiver.

3. The method according to claim 1, wherein the adjusting comprises:
when the amount of the available power is less than the sum of the amounts of the minimum required powers of the amplifiers, sequentially cutting off the amplifiers based on priority until the amount of the available power is equal to or greater than the sum of the amounts of the minimum required powers of the amplifiers.

4. The method according to claim 3, wherein the priority differs according to the location of the vehicle.

5. The method according to claim 4, wherein the location of the vehicle is determined based on a signal arrival distance from a location signal generating device to the vehicle by comparing power of the signals received by the plurality of receivers through the antennas with power of the signals set by communication technologies.

6. The method according to claim 5, wherein the location of the vehicle is determined using the signal arrival distance, GPS information of the location signal generating device, and GPS information of the vehicle.

7. The method according to claim 1, wherein the adjusting comprises:
lowering power of an amplifier using a larger amount of power than the amount of minimum required power of the amplifier to the minimum required power of the amplifier; and
redistributing remaining power after lowering power to other amplifiers.

8. The method according to claim 1, wherein the adjusting further comprises cutting off power supplied to an amplifier included in a corresponding receiver when no signal is received by the plurality of receivers or the GPS receiver through the antennas.

9. An application program configured to be executed by a processor and configured to implement the method according to claim 1, wherein the application program is recorded in a non-transitory computer-readable recording medium.

10. An apparatus for controlling a wireless communication device used in a vehicle, the apparatus comprises:
a global positioning system (GPS) receiver configured to receive a GPS signal;
a plurality of receivers configured to receive signals wirelessly transmitted in correspondence to different communication technologies;
a localization process module configured to determine a level of a localization service based on a location of the vehicle; and
a power consumption management module configured to monitor power of the signals received through antennas by the GPS receiver and the plurality of receivers and monitor power used by amplifiers for amplifying the signals and to adjust operation of the plurality of receivers and the GPS receiver, according to the level of the localization service and an amount of available power in the vehicle,
wherein the power consumption management module is configured to:
recognize the amount of the available power in the vehicle,
recognize respective amount of use powers of the amplifiers and respective amount of minimum required powers of the amplifiers, and
distribute some of the amount of the available power corresponding to a difference between the amount of the available power and a sum of the amounts of the minimum required powers of the amplifiers to an amplifier using a less amount of power than minimum required power of the amplifier, when the amount of the available power is greater than the sum of the amounts of the minimum required powers of the amplifiers.

11. The apparatus according to claim 10, wherein the plurality of receivers include a Wi-Fi receiver, a Bluetooth receiver, and a Zigbee receiver.

12. The apparatus according to claim 10, wherein the power consumption management module,
sequentially cuts off the amplifiers based on priority until the amount of the available power is equal to or greater than the sum of the amounts of the minimum required powers of the amplifiers, when the amount of the available power is less than the sum of the amounts of the minimum required powers of the amplifiers.

13. The apparatus according to claim 12, wherein the priority differs according to the location of the vehicle.

14. The apparatus according to claim 13, wherein the localization process module determines the location of the vehicle, based on a signal arrival distance from a location signal generating device to the vehicle by comparing power of signals received by the plurality of receivers through antennas with power of the signals set by communication technologies.

15. The apparatus according to claim 14, wherein the localization process module determines the location of the vehicle using the signal arrival distance, GPS information of the location signal generating device, and GPS information of the vehicle.

16. The apparatus according to claim 10, wherein the power consumption management module,
　lowers power of an amplifier using a larger amount of power than the amount of minimum required power of the amplifier to the minimum required power of the amplifier, and
　redistributes remaining power after lowering power to other amplifiers.

17. The apparatus according to claim 10, wherein the power consumption management module cuts off power supplied to an amplifier included in a corresponding receiver when no signal is received by the plurality of receivers or the GPS receiver through the antennas.

18. The apparatus according to claim 10, wherein the power consumption management module comprises:
　a receiving power monitoring module configured to monitor power of the received signals and power of signals amplified by the amplifiers and output monitored power;
　a localization variance monitoring module configured to monitor variation in information for the localization service in correspondence to variation in the location of the vehicle; and
　a control and decision module configured to control power supplied to the plural receivers and the GPS receiver.

* * * * *